United States Patent [19]

Crackel

[11] 4,333,055
[45] Jun. 1, 1982

[54] DIGITAL PHASE-FREQUENCY DETECTOR

[75] Inventor: John E. Crackel, Carson, Calif.

[73] Assignee: TRW Inc., Redondo Beach, Calif.

[21] Appl. No.: 97,087

[22] Filed: Nov. 23, 1979

[51] Int. Cl.³ ............................................... H03K 5/26
[52] U.S. Cl. .................................. 328/133; 307/514;
307/525
[58] Field of Search ................ 307/232, 233; 328/133, 328/134

[56] References Cited

U.S. PATENT DOCUMENTS

| | | | |
|---|---|---|---|
| 3,328,688 | 6/1967 | Brooks | 328/133 X |
| 3,430,148 | 2/1969 | Miki | 328/133 |
| 3,514,705 | 5/1970 | Feigleson | 328/133 |
| 3,626,307 | 12/1971 | Koyama | 328/133 |
| 3,750,035 | 7/1973 | Crow | 328/133 |
| 3,755,747 | 8/1973 | Letosky | 307/232 X |

*Primary Examiner*—John S. Heyman

*Attorney, Agent, or Firm*—Robert W. Keller; Donald R. Nyhagen

[57] ABSTRACT

Digital circuitry, and a corresponding method for its operation, for detecting frequency or phase-angle differences between two digital input signals. The detector includes a differentiating circuit to provide signals indicative of the times of occurrence of a selected feature of the input signals, such as a pulse edge, and a pair of memory devices, such as flip-flops, which can be set by respective input signals. The detector further includes a feedback circuit operative to clear both flip-flops in the event that the input signals would be effective to place both of them in a set condition. The feedback circuit operates in a parallel, rather than a series timing relationship with input circuitry that sets the flip-flops, and the performance of the detector is thereby significantly improved, as evidenced by a smaller dead zone in its phase output characteristic for a given frequency of operation, or a capability of operation at higher frequencies for a given degree of degradation.

18 Claims, 15 Drawing Figures

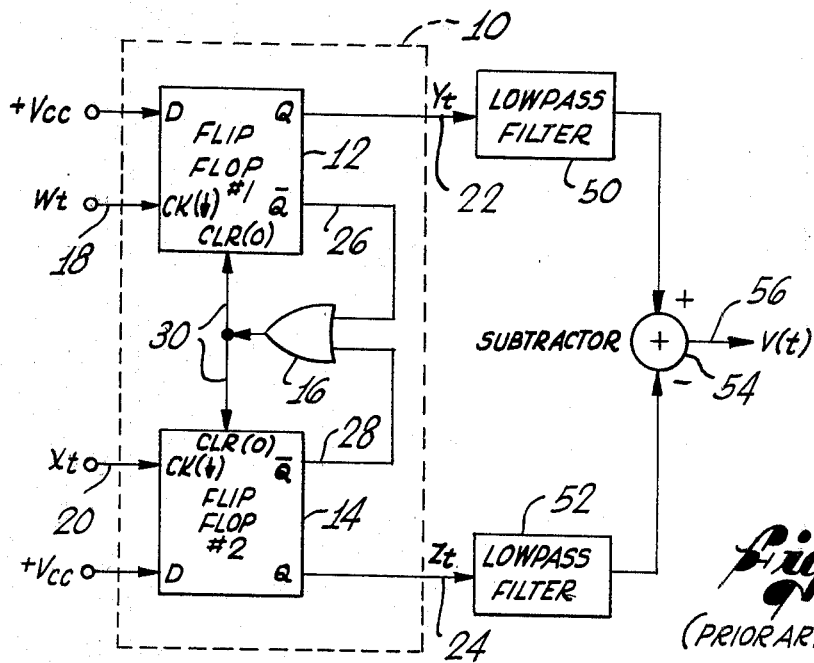
Fig.1 (PRIOR ART)
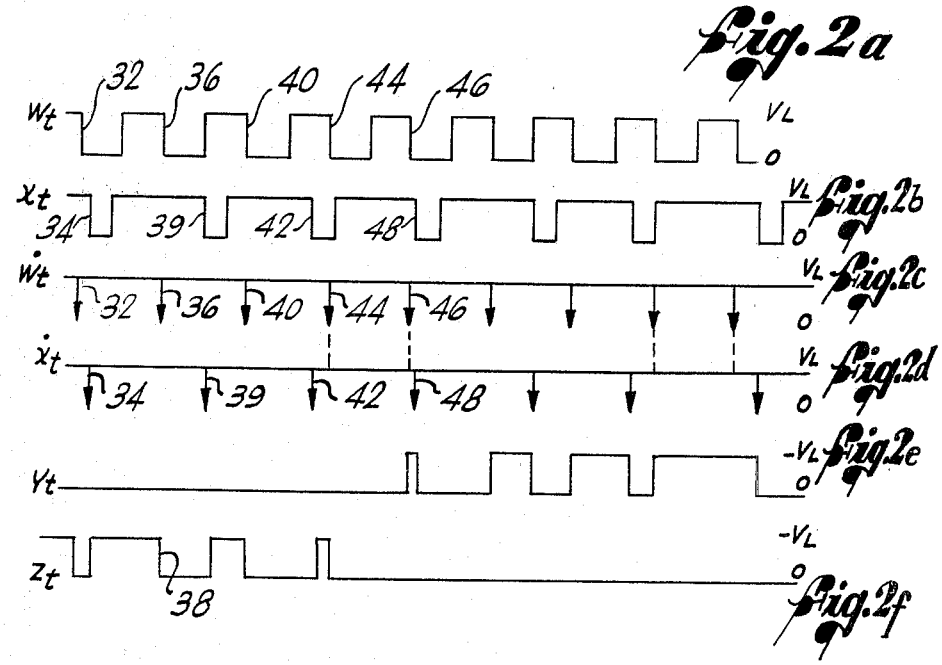

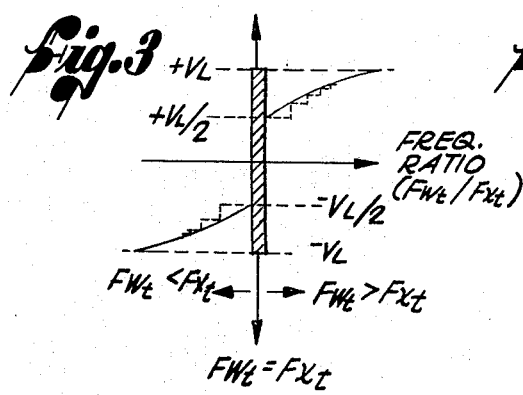
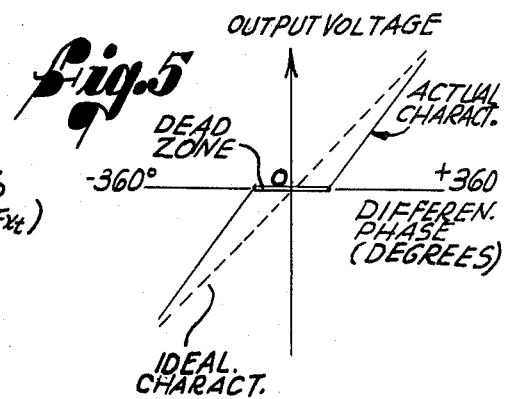
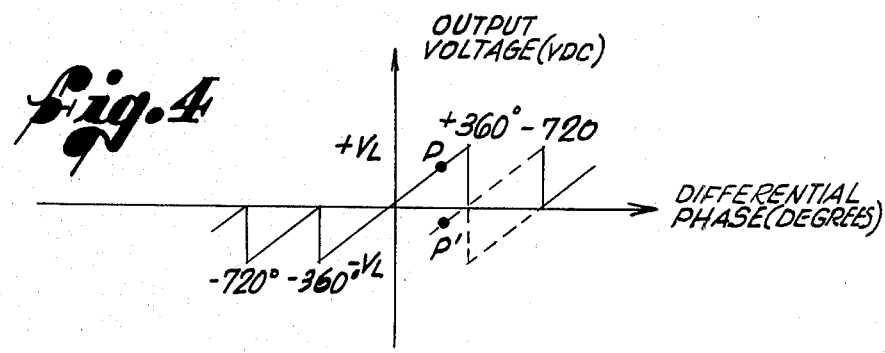
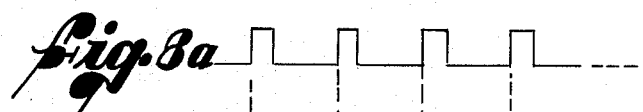
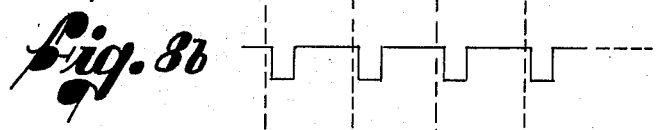
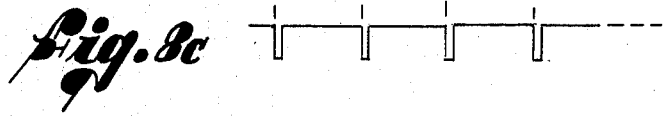

DIGITAL PHASE-FREQUENCY DETECTOR

The Government has rights in this invention pursuant to Contract No. F04701-71-C-0131 awarded by the Department of the Air Force.

BACKGROUND OF THE INVENTION

This invention relates generally to circuits for the comparison of the phase or the frequency of two input signals, and, more particularly, to digital circuits for the detection of phase or frequency differences between two digital, or digitized, input signals.

Circuits for the quantitative detection of a difference between the frequencies of two signals, or of a phase difference between two signals of equal or nearly equal frequency, are useful in a variety of applications, particularly in communication systems. In a conventional circuit implementation of a digital phase and frequency detector, each of the input signals takes the form of a train of rectangular pulses, which is first differentiated to define a rising or falling edge of each pulse. The resulting signal is then applied as an input to a memory device, such as a flip-flop, of which there is one for each input signal. Differentiation may be performed inherently in the flip-flops, which typically operate in response to a rising or falling edge of a clock pulse, and which, for purposes of explanation, are referred to as the first and second flip-flops.

The logical states of the two flip-flops are determined both by the respective inputs derived from the two digital input signals, and by the operation of a feedback circuit, which controls the states of the flip-flops in response to detection of particulaar current combined states. More specifically, each of the flip-flops can be so connected as to be set to a logical "one" upon the detection of a falling edge of an input signal applied to its clock terminal. The feedback circuit is typically implemented in the form of an OR gate, the inputs of which are derived from the inverted outputs of the flip-flops, and the output of which is applied to clear both flip-flops to a logical zero when the OR gate output is a logical zero. Consequently, when an attempt is made to set both of the flip-flops, the OR gate inputs are zeros and a zero OR gate output immediately clears both of the flip-flops. The "both set" condition of the flip-flops is termed a forbidden state or condition in such a circuit. As will shortly become apparent, the performance of the circuit will be significantly improved by minimization of the time spent in the forbidden state.

If the first flip-flop receives input signals at a higher frequency than the second flip-flop, the first flip-flop will be set upon the detection of the falling edge of a pulse of the first input signal, and will be reset upon subsequent detection of the falling edge of a pulse of the second input signal. The second flip-flop, on the other hand, will remain cleared or reset, since the next-occurring input pulse after the flip-flops have been cleared will be supplied by the higher frequency input signal, which will set the first flip-flop again. Thus, the second flip-flop will stay reset so long as the frequency of the signal applied to it is less than the frequency of the signal applied to the first flip-flop. The characteristic output condition for the two flip-flops in such a circuit is that there is one so-called "enabled" flip-flop, which produces a digital output signal, the duty cycle of which varies in accordance with the input signal frequency difference, and a so-called "disabled" flip-flop with a logical zero output. The identity of the enabled and disabled flip-flops changes only when the frequency difference changes sign, i.e. when the input signal of lower frequency becomes the one of higher frequency.

In one common arrangement for producing an analog signal representative of the input signal frequency difference, the digital output from each of the flip-flops is low-pass filtered, and then applied to a subtractor circuit, by means of which one signal is subtracted from the other to produce a signed analog output. Thus, for example, the first flip-flop can be arranged to produce a positive analog output when it is enabled, and the second flip-flop to produce a negative analog output when it is enabled.

Difficulties with this conventional design arise principally from the fact that circuit reaction times are not zero, as assumed in the foregoing discussion. In order for both flip-flops to be reset to a logical zero state, their outputs must both be set to logical ones for a short period of time. If the frequency of the input signals is low enough, the duration of this forbidden state will be quite small relative to the period of the input signals, and may not significantly affect the operation of the circuit. The effect of these brief occurrences of the forbidden state will be to produce narrow output pulses from the disabled flip-flop. Although these narrow pulses might be suppressed by appropriate filtering, it will be apparent that the filtered output voltage from the disabled side of the circuit will then be approximately constant for a constant frequency of the input signal to that side, since a forbidden-state pulse will be produced for each pulse applied to the disabled flip-flop. Moreover the effect of the narrow, forbidden-state pulses will become more significant as the output of the enabled side approaches zero.

Another form of degradation in the performance of a phase-frequency detector of this type occurs when triggering pulses to each side of the circuit are so close together in time that complete setting and resetting operations cannot be performed. This indeterminate toggling of the outputs may result in a zero output signal for some distance on each side of the in-phase condition, yielding a "dead zone" in the output characteristic of the circuit, which is the variation of the output signal plotted against the phase difference between the input signals.

The size of the dead zone is further increased due to the fact that resetting operations for the conventional digital phase-frequency detector circuit are performed in a series timing relationship with the setting operations. There are additional time delays associated with the feedback circuit, and these also affect the resetting operation. These feedback delays include an OR gate delay, as well as any additional memory delay that may be needed to ensure the clearing of both flip-flops in response to a common control signal derived from both flip-flop outputs. The dead zone in the phase characteristic of a circuit of this type represents a total time delay that is approximately constant for a given circuit, and provides a convenient means for comparing the performances of various phase-frequency detector circuits.

It will be apparent from the foregoing that there is a significant need for a digital phase-frequency detector circuit in which both the inherent circuit time delays and the occurrence of forbidden states of the flip-flops are both minimized, to provide a reduced dead zone at any given frequency, or to provide higher frequency capability for a given dead zone. The present invention fulfills this need.

SUMMARY OF THE INVENTION

The present invention resides in an improved digital phase-frequency detector circuit, and a corresponding method for its operation, in which the reset operation is implemented in parallel with the set operation, instead of in series, as in a conventional circuit. Accordingly, at a given frequency, the dead zone of the phase characteristic is significantly smaller or, for a given degradation in the linearity of the phase characteristic, the frequency capability of the input circuit is higher.

More specifically, the improved circuit comprises differentiation means for processing two input signals, to obtain differentiated signals indicative of the times of occurrence of selected features of the input signals, and two memory means for receiving the differentiated signals as inputs and providing a pair of output signals. The circuit is connected in such a manner that each memory means will be cleared upon detection of an input signal to the other memory means, and will be set by detection of an input signal to itself, but only if the other memory means is presently clear. Stated another way, each of the two memory means includes a setting input circuit responsive to detection of an input pulse from its corresponding input signal, and enabled by a clear condition in the other memory means, and further includes a clearing or resetting circuit responsive to an input signal to the other memory means.

In terms of a novel method, the present invention includes the steps of differentiating two input signals to obtain two trains of trigger pulses corresponding in time to selected features of the input signals, setting each of the two memory devices on the occurrence of a corresponding trigger pulse, if the other of the memory devices is clear, and resetting each of the memory devices on the occurrence of a trigger pulse directed to the other. A critical aspect of the invention is that the resetting or feedback function of the circuit is implemented in parallel with the setting function, and both memory devices are never simultaneously in the "set" state, even for a short time.

By way of more specific example, each memory means may be considered to be a D-type flip-flop, which is set by the simultaneous presence of a "true" or "one" logic level on its D terminal and a falling clock pulse on its clocking terminal, to which one of the input signals is applied. Each flip-flop also has a clear terminal to which is applied a differentiated form of the input signal to the clocking terminal of the other flip-flop. The feedback circuit is provided by cross-connecting the $\overline{Q}$ outputs of the flip-flops to the D terminals, and by cross-connecting the input signals to the clear terminals of the flip-flops.

As will be better appreciated from the drawings and the more detailed description that follows, the circuit is functionally equivalent to the ideal digital phase-frequency detector briefly described in the background section of this application. In operation, an input signal applied to a first of the flip-flops will set that flip-flop only if the other flip-flop is not already set. If the other flip-flop is already set, it will be cleared by the occurrence of the input signal to the first flip-flop. Thus, the forbidden state, in which both flip-flops are set, does not have to occur and be detected in order for both flip-flops to be cleared. In effect, the feedback control function is a parallel rather than a serial one in terms of time delay. Since the forbidden state never occurs, there will be much less deviation from the ideal output voltage-versus-phase characteristic, and a much smaller dead zone for any given operating frequency.

In one specific embodiment of the invention disclosed herein, differentiation is effected by means of pairs of NAND gates, and the memory means are provided by JK flip-flops. Each J terminal is supplied by the inverted output ($\overline{Q}$) of the other flip-flop, and each K terminal is supplied by the uninverted output (Q) of the other flip-flop. Each pair of NAND gates functions to provide a very narrow differentiated pulse corresponding in time to the occurrence of a rising edge of an input signal pulse.

It will be appreciated from the foregoing that the present invention provides a significant advance over conventional digital phase-frequency detector circuits. In particular, the invention provides a novel technique whereby a feedback control function is implemented in parallel with an input signal, in order to avoid signal time delays and to avoid the occurrence of a forbidden state of the circuit, thereby increasing the frequency at which the circuit may be effectively operated. Other aspects and advantages of the invention will become apparent from the following more detailed description, taken in conjunction with the accompanying drawings.

BRIEF DESCRIPTION OF THE DRAWINGS

FIG. 1 is a simplified block diagram of a digital phase-frequency detector circuit of the prior art, including output circuitry to derive an analog voltage from a phase or frequency difference between two digital input signals;

FIGS. 2a–2f together comprise a timing diagram showing the relationship between input and output signals of an idealized digital phase-frequency detector circuit;

FIG. 3 is a graph showing an envelope of the output voltage-versus-frequency characteristic of an ideal digital phase-frequency detector circuit;

FIG. 4 is a graph showing an output voltage-versus-phase characteristic of an ideal digital phase-frequency detector circuit;

FIG. 5 is a graph showing an actual output voltage versus-phase characteristic, illustrating distortion from the ideal characteristic shown in FIG. 4;

FIGS. 8a–8c together comprise a timing diagram relating to a differentiation circuit included in FIG. 7.

DETAILED DESCRIPTION

Figure 6:
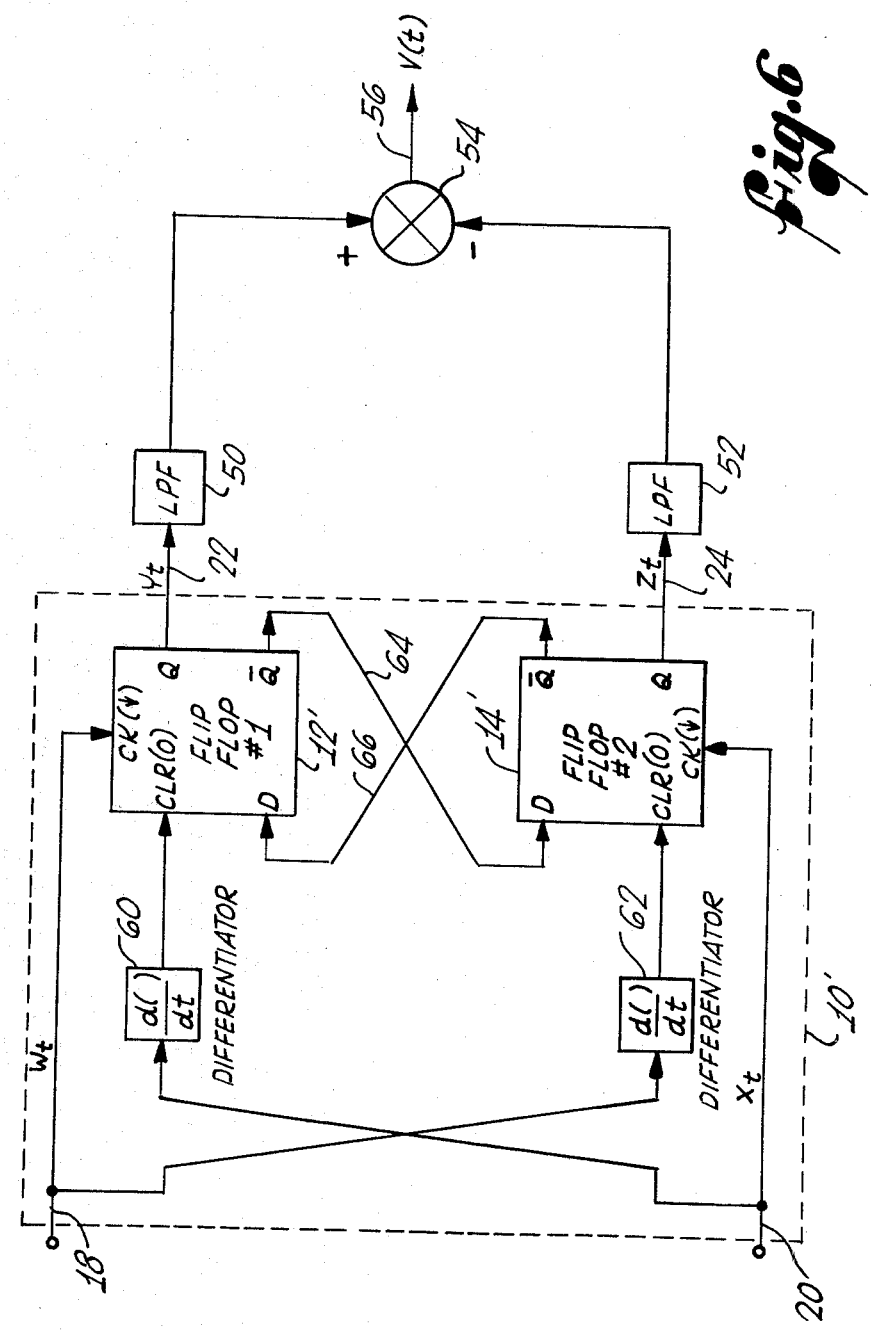
FIG. 6 is a simplified block diagram of the improved digital phase-frequency detector circuit of the invention.

As shown in the drawings for purposes of illustration, the present invention is concerned with improvements in a digital phase-frequency detector circuit. FIG. 1 shows such a circuit within the the broken line indicated by reference numeral 10. Basically, the circuit 10 comprises a pair of flip-flops 12 and 14, and an OR gate 16. The inputs to the digital phase-frequency detector circuit 10 are indicated at $W_t$, on line 18, and $X_t$ on line 20, and the output signals are indicated at $Y_t$ on line 22, and $Z_t$ on line 24. The input signals $W_t$ and $X_t$ are trains of digital pulses, the frequency of which may vary, and the function of the digital phase-frequency detector circuit 10 is to provide signals on lines 22 and 24 indicative of the difference between the frequency or the phase of the input signals. It will be understood that the input signals $W_t$ and $X_t$ may be derived from sinusoidal or more complex waveforms by appropriate processing to obtain relatively rectangular pulses.

The conventional circuit shown in FIG. 1 has significant deficiencies that are largely minimized by the present invention. However, before these can be meaningfully discussed, the prior art circuit must be explained in some detail. For purposes of illustration, the flip-flops 12 and 14 are shown as D-type flip-flops. In a D-type flip-flop, a logic level applied to the D terminal is transferred to the Q output terminal upon the occurrence of a falling clock pulse applied to the clock terminal, indicated at CK. Also for purposes of illustration, the flip-flops 12 and 14 are assumed to operate on positive logic, i.e., a "false" or logical "zero" level is defined as zero volts dc, and a "true" or logical "one" level is defined as $+V_L$ volts dc.

As shown in FIG. 1, a power supply level $+V_{cc}$ is applied to each of the D terminals, and since $V_{cc}$ is greater than or equal to $V_L$, a true or logical one level is always applied to the D terminals. Thus, upon the occurrence of a falling edge of a clock pulse, a logical one level is impressed upon the Q output terminal, and the flip-flop is said to be set. Each of the flip-flops 12 and 14 can be cleared or reset only upon the occurrence of a false or logical zero level applied to the clear terminal indicated at CLR. It will be noted that the output signals $Y_t$ and $Z_t$, on lines 22 and 24 respectively, are derived from the Q terminals of respective flip-flops 12 and 14. The inverse output terminals ($\overline{Q}$) are connected by lines 26 and 28, respectively, as inputs to the OR gate 16, the output of which is connected by lines 30 to the clear terminals of the flip-flops.

The OR gate 16 provides a logical zero output, operative to clear the flip-flops 12 and 14, only when both of its inputs are zero, i.e. when both flip-flops are in a set condition. If either or both of the flip-flops 12 and 14 are not set, the OR gate output is a logical one, and no clearing signal is applied to the flip-flops.

Operation of the conventional circuit of FIG. 1 can be best understood by reference to FIGS. 2a–2f. FIG. 2a and FIG. 2b represent the input waveforms of $W_t$ and $X_t$ on lines 18 and 20, respectively. It will be seen that these input signals are of different frequencies and, to illustrate the generality of the circuit, are shown as having different duty cycles. It will be understood, however, that the duty cycles are of no significance, since only a falling or rising edge of each of the pulses is employed to actuate the circuitry. Some form of differentiation circuitry is utilized to detect the edges of the pulses. In the example shown in FIG. 1, it is assumed that the inherent characteristic of the flip-flops 12 and 14 to respond to the falling edge of a clock pulse, is the only form of differentiation circuitry that is required. FIGS. 2c and 2d show diagrammatically the corresponding positions, on the same time axis, of the falling edges of each of the input signal pulses, these falling edges being indicated by downwardly directed arrows, and referred to as trigger pulses. FIGS. 2e and 2f show the corresponding output signal waveforms of the signals on lines 22 and 24.

For purposes of explanation, suppose that the first-shown falling edge of signal $W_t$, indicated at 32, has the effect of clearing both flip-flops 12 and 14. The next falling edge of the input signal $X_t$ on line 20, indicated at 34 in FIGS. 2b and 2d, will have the effect of setting flip-flop 14. On the occurrence of the next $W_t$ trigger pulse on line 18, shown at 36, there will be a very brief period (not shown) when both flip-flops are set. However, the setting of both flip-flops 12 and 14 causes a logical zero signal to be generated on line 30 from the OR gate, and both flip-flops are then immediately cleared. Having both flip-flops set is a condition referred to as the forbidden state, and, in the ideal case, this state should not occur at all or, if it does, should occur for such a short time that it has little or no effect on the operation of the circuit.

With reference again to FIG. 2, it will be apparent that the occurrence of the trigger pulse 36 on line 20 will result in clearing of both flip-flops 12 and 14, so that the output on line 24 will fall to zero again, as shown at 38 in FIG. 2f. This cycle of events will be repeated upon the occurrence of trigger pulse 39 on line 20 and trigger pulse 40 on line 18, and repeated again on the occurrence of trigger pulses 42 and 44. After the occurrence of trigger pulse 44 on line 18, however, the frequency of pulses on line 18 is such that there will be two pulses, the pulse 44 and a subsequent trigger pulse 46, before the occurrence of the next pulse 48 on line 20. The effect of the pulse 46 is to set flip-flop 12, since both flip-flops were clear prior to the time of pulse 46. Subbsequently, pulse 48 will reset flip-flop 12, and the "enabled" output will have been switched from line 24 to line 22. This illustrates a typical sequence of operations of a digital phase-frequency detector, in which there is always one enabled flip-flop and one disabled flip-flop, at any given time. Only the enabled flip-flop, which is the one corresponding to the input signal of highest frequency (at least one period of the difference frequency), produces an output, while the disabled flip-flop produces zero output.

Typically, the output lines 22 and 24 are passed through low-pass filters 50 and 52, respectively, and thence to a subtractor circuit 54, where the two signals are subtracted to produce a difference signal V(t) on ouput line 56. Since the output signal on line 56 is affected positively by signals from flip-flop 12 and negatively by signals from flip-flop 14, the resulting output signal indicates in sign and magnitude, in a staircase manner, the degree of mismatch between the frequencies of the two input signals on lines 18 and 20.

The ideal frequency characteristic of the FIG. 1 circuit is shown on FIG. 3, in which the output voltage on line 56 is plotted, along the y axis, with respect to the frequency ratio expressed as $FW_t/FX_t$, plotted along the x axis. The y axis is positioned at a frequency ratio of unity, and the shaded region close to the y axis is the domain of phase discrimination, illustrated in more detail in FIG. 4. As the frequency of the $W_t$ input signal increases to a relatively large value, flip-flop 12 is enabled for increasing periods of time, until an output signal approaching $+V_L$ is achieved, as indicated by the area to the right of the y axis in FIG. 3. On the other hand, when flip-flop 14 is enabled the output signal approaches $-V_L$, as indicated by the area to the left of the y axis in FIG. 3.

As the frequency ratio of the input signals approaches unity from a higher value, an output signal approaching $\frac{1}{2} V_L$ is obtained. As the unity frequency ratio is approached from a lower value, an output signal approaching $-\frac{1}{2} V_L$ is obtained.

For values of frequency ratios at or close to unity, the precise level of the output voltage depends on the phase difference between the input signals. The ideal phase characteristic is shown in FIG. 4 as having an odd symmetry about the origin, with positive values of phase difference resulting in positive output voltages, and negative values of phase difference resulting in negative output voltages, as shown by the solid line in FIG. 4. It should be noted, however, that the characteristic is really a two-valued function of the phase difference, since the output has unique values across a phase interval of 720 degrees centered at the origin. It will be apparent, therefore, that the characteristic shown partially by broken lines in FIG. 4 is an equally valid one, and each point, such as the point P on the solid line characteristic has an equally valid counterpart P' on the broken line.

The preceding explanation assumes that circuit reaction times are zero, and that the forbidden state, in which both flip-flops 12 and 14 are set, is never attained for a significant period of time. For relatively low-frequency inputs, these assumptions hold true, since the times during which the forbidden state is obtained will be small relative to the period of the incoming signals, and resulting narrow pulses on the disabled side of the circuit can be effectively suppressed by the low-pass filters 50 and 52 in FIG. 1. These filtered pulses will result in an approximately constant output error, for a given input frequency, which will not become important until the output from the enabled side of the circuit approaches zero. This is illustrated in FIG. 5, where an actual phase characteristic is compared with a central portion of the ideal characteristic shown in FIG. 4.

It will be seen from FIG. 5 that, as the phase difference approaches zero, the actual characteristic departs further and further from the ideal characteristic. At points located at a substantial distance from the origin, this distortion is due primarily to the occurrence of the forbidden state with each trigger to the disabled side of the circuit. When the zero-phase condition is approached very closely, the triggers to each side of the circuit are so close together in time that full set and reset operations cannot be completed rapidly enough. The resultant outputs tend to sum to zero after filtering, and this results in a relatively flat portion of the characteristic in the area on each side of the origin. This flat portion is termed the dead zone, and is characteristic of practically all digital phase-frequency detector circuits, since complete elimination of the dead zone would require zero reaction times. An excessively large dead zone is present in the conventional circuit of FIG. 1, however, because the resetting operations in the circuit are performed effectively in series with the setting operations.

In accordance with the invention, a digital phase-frequency detector circuit is provided with a parallel, rather than series resetting operation, resulting in a vastly improved performance, as evidenced by a smaller dead zone for a given frequency of operation, or an improved frequency capability for a given degree of degradation as indicated by a dead zone of a particular size.

As shown in FIG. 6, the improved circuit, indicated at 10', still includes inputs $W_t$ and $X_t$ on lines 18 and 20, respectively, and outputs $Y_t$ and $Z_t$ on lines 22 and 24, respectively, these being connected, as before, through the low-pass filters 50 and 52 to the subtractor circuit 54, which provides the output signal on line 56. The circuit 10' of the invention comprises two flip-flops, here indicated as D-type flip-flops 12' and 14', and two differentiator circuits, indicated at 60 and 62, respectively. As in the conventional digital phase-frequency detector circuit shown in FIG. 1, the input lines 18 and 20 are connected to the clock terminals of the flip-flops 12' and 14', and the Q output terminals of the flip-flops supply signals to the respective output lines 22 and 24.

In the improved circuit of the invention, the inverse or Q outputs from the flip-flops 12' and 14' are cross-connected to the D terminals of the flip-flops, i.e., the Q output from flip-flop 12' is connected by line 64 to the D terminal of flip-flop 14', and the Q output of flip-flop 14' is connected by line 66 to the D terminal of flip-flop 12'. Input line 18, in addition to being connected to the clock terminal of flip-flop 12', is connected through differentiator 62 to the clear terminal of flip-flop 14'. Similarly, input line 20, in addition to being connected to the clock terminal of flip-flop 14', is connected through differentiator 60 to the clear terminal of flip-flop 12'. It will be apparent from these cross-connections that the operation of the circuit is governed by two basic rules. First, each of the flip-flops 12' and 14' can be set by a falling clock pulse on its clock terminal only when the other of the flip-flops is clear, as indicated by a logical one output on its Q terminal, and second, each of the flip-flops 12' and 14' will be reset by an input trigger pulse directed to the other flip-flop. It is assumed that each of the differentiators 60 and 62 will provide a clearing signal at practically the same time that a falling edge is detected in the input signal applied to the differentiator.

It will also be apparent that the forbidden state, wherein both flip-flops are set simultaneously, can never be achieved, since neither of the flip-flops can be set at all unless it is provided with a signal at its D terminal indicating that the other of the flip-flops is already clear. Thus, if flip-flop 14' is set, for example, and flip-flop 12' is clear, an input signal on line 18 would fail to set flip-flop 12' and would immediately clear flip-flop 14'. The setting and clearing operations are essentially in parallel, rather than in series, thereby eliminating one important source of performance degradation referred to earlier.

Figure 7:
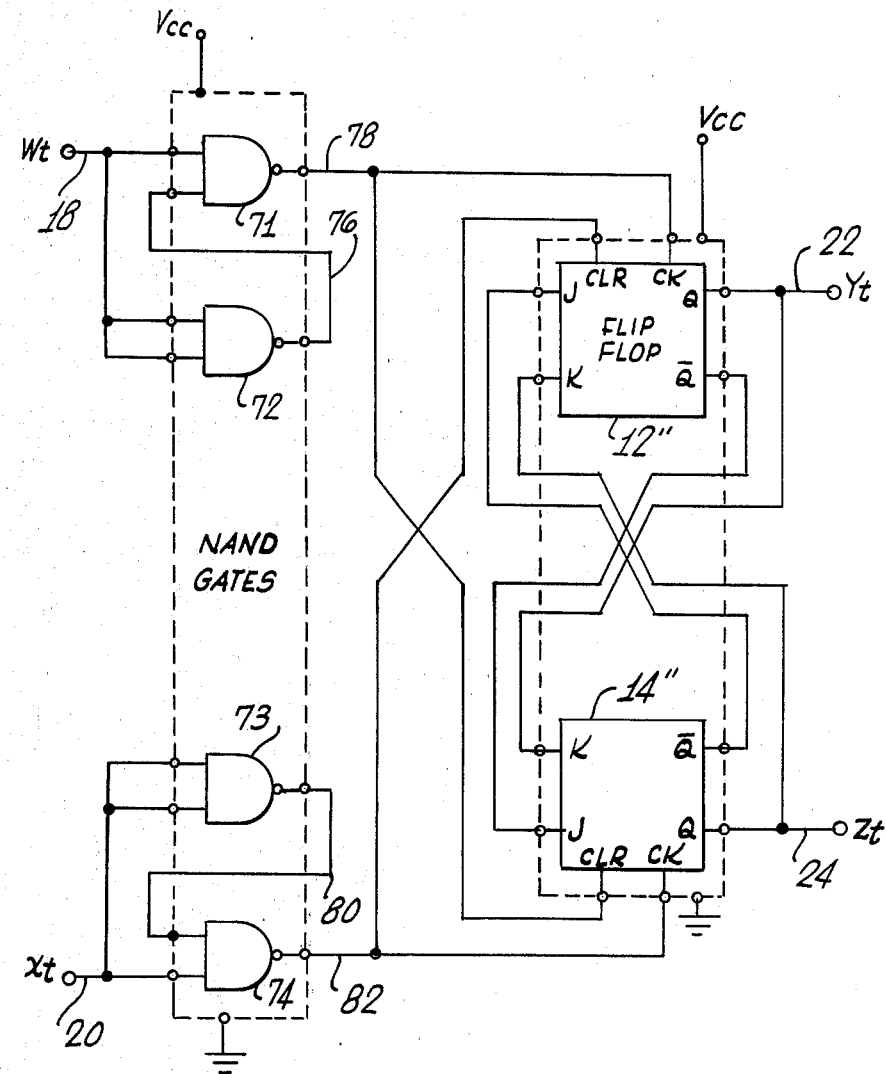
FIG. 7 is a more detailed schematic diagram of the digital phase-frequency detector of FIG. 6.

A more detailed implementation of the digital phase-frequency detector circuit 10' is shown in FIG. 7. For consistency, the input lines are again referred to by reference numerals 18 and 20, and the output signal lines by reference numerals 22 and 24. In this case, there are two JK flip-flops 12" and 14", and differentiation of the input signals is effected by means of a set of four NAND gates 71-74.

NAND gate 72 derives both of its inputs from input line 18 and has its output connected by line 76 as an input to NAND gate 71, the other input of which is also derived from input line 18. The output of NAND gate 71, on line 78 is then applied to the clock terminal of flip-flop 12" and to the clear terminal of flip-flop 14". Likewise, input line 20 is connected to both inputs of NAND gate 73, the output of which is connected by line 80 as an input to NAND gate 74. The other input of NAND gate 74 is also derived from line 20, and the output of NAND gate 74, on line 82 is connected to the clock terminal of flip-flop 14" and to the clear terminal of flip-flop 12".

As in the FIG. 6 circuit, the Q outputs of flip-flops 12" and 14" provide the output lines 22 and 24. The Q and Q outputs of flip-flop 12' are connected to the K and J inputs, respectively, of flip-flop 14", and the Q and Q outputs of flip-flop 14" are connected to the K and J inputs, respectively, of flip-flop 12". These latter cross-connections are equivalent to the cross-connections to the D terminals of flip-flops 12' and 14' shown in FIG. 6. For either of the flip-flops 12" and 14" to be set unambiguously by a clock pulse on its clocking terminal, its J terminal has to be in the "true" or logical one state and its K terminal in the "false" or logical zero state, meaning that the other of the flip-flops must be in a clear or reset condition.

FIGS. 8a–8c together comprise a timing diagram relative to operation of the NAND gates 71–74. NAND gate 72 functions as an inverter and a delay circuit, providing a signal on line 76 which is inverse to the input signal on line 18, and is delayed very slightly in time, due to the inherent circuit delay of the NAND gate 72. Thus, the inputs to NAND gate 71 are shown in FIG. 8a and FIG. 8b. FIG. 8a shows the input signal on line 18 and FIG. 8b shows the inverted and delayed signal on line 76. The output on line 78 is, therefore, as shown in FIG. 8c and represents a differentiated form of the input signal on line 18, providing a narrow pulse for each rising edge of an input pulse. The falling edge of each of the pulses shown in FIG. 8c is operative both to set flip-flop 12" if flip-flop 14" is clear, and to clear flip-flop 14" if it happens to be set. It will be apparent, therefore, that the circuit of FIG. 7 differs from that of FIG. 6 in only one significant functional respect. The FIG. 7 circuit is triggered by rising edges of input pulses, rather than by falling edges. In a similar fashion to NAND gate 72, NAND gate 73 also operates as an inverter and time delay, and produces on line 82 a string of differentiated pulses like those shown in FIG. 8c. The falling edges of these pulses are operative to set flip-flop 14" if flip-flop 12" is clear, and to clear flip-flop 12" if it happens to be set.

Although the signals $Y_t$ and $Z_t$ on lines 22 and 24 are shown to be combined in an analog signal processor, in alternative embodiments the signals can be combined digitally, by employing, for example, digital filters, microprocessors, or set-reset flip-flops.

It will be appreciated from the foregoing that the present invention represents a significant advance in the field of digital phase-frequency detector circuits. In particular, it provides a circuit having a substantially improved phase output characteristic, as evidenced by either a dead zone of reduced size for a given frequency of operation, or by a capability of operation at higher frequencies, for the same degree of degradation and size of dead zone. It will also be appreciated that, although particular embodiments of the invention have been described in detail for purposes of illustration, various modifications may be made without departing from the spirit and scope of the invention. Accordingly, the invention is not to be limited except as by the appended claims.

I claim:

1. A digital phase-frequency detector circuit, for detecting differences in phase and frequency of two input signals, said circuit comprising:

two digital memory means, corresponding to the two input signals, each switchable to a first memory state in response to occurrence of a selected feature in its input signal, and to a second memory state upon the occurrence of the same selected feature of the other input signal, whereby any attempt to switch one of said memory means to the first state always results in simultaneously setting the other of said memory means to the second state; and means for preventing each of said memory means from being set to the first state unless the other of said memory means is in the second state;

whereby only one of said memory means can be in the first state at any time, and the states of said memory means provide an indication of phase and frequency difference between the two input signals.

2. A digital phase-frequency detector circuit as set forth in claim 1, and further including signal processing means for combining the instantaneous states of said two memory means to provide an output signal indicative of the frequency or phase difference between the input signals.

3. A digital phase-frequency detector circuit as set forth in claim 2, wherein said signal processing means includes:

low-pass filter means connected to said memory means to provide analog signals indicative of the proportion of time that each of said memory means is in the first memory state; and signal subtraction means, for subtracting one filtered analog signal from the other, to obtain the analog output signal.

4. A digital phase-frequency detector circuit as set forth in claim 1, wherein said memory means are inherently responsive to the selected features of the input signals.

5. A digital phase-frequency detector circuit as set forth in claim 1, and further including separate means for distinguishing the selected features of the input signal.

6. A digital phase-frequency detector circuit as set forth in claim 5, wherein said separate means is a differentiating circuit to detect pulse edges in said input signals.

7. A digital phase-frequency detector circuit as set forth in claim 1, wherein:

said memory means are D-type flip-flops;

the input signals are coupled to clocking terminals of respective ones of said flip-flops; and said means for preventing each of said memory means from being set to the first state include means cross-coupling inverted outputs of said flip-flops to D terminals thereof, whereby a clocking signal will not set either of said flip-flops to the first memory state unless the other of said flip-flops is already in the second memory state.

8. A digital phase-frequency detector circuit as set forth in claim 7, wherein the input signals are cross-connected to clearing terminals of said flip-flops, whereby an input signal to one of said flip-flops is operative to clear the other of said flip-flops to the second memory state.

9. A digital phase-frequency detector circuit, for detecting differences in the phase and frequency of two input signals, said circuit comprising:

two flip-flops, having clocking terminals, reset terminals, data output terminals, and data input terminals; and differentiating means, for differentiating the input signals, to obtain differentiated signals indicative of times of occurrence of pulse edges in the input signals;

wherein the input signals are connected to corresponding clocking terminals and are cross-connected through said differentiating means to opposite reset terminals, to reset one of said flip-flops at the same time as an input signal is applied to clock the other of said flip-flops in an attempt to set it, and wherein said data output terminals are cross-connected to opposite data input terminals, to allow each of said flip-flops to be set by an input signal only when the other of said flip-flops is already reset.

10. A digital phase-frequency detector circuit as set forth in claim 9, and further including:
two low-pass filters connected one to each of said data output terminals; and
analog signal subtraction means, connected to receive the outputs of said filters, to provide a signed analog signal indicative of the difference in frequency or phase of the two input signals.

11. A digital phase-frequency detector circuit as set forth in claim 9, wherein:
said flip-flops are of the D type and said input terminals are the D terminals;
each of said flip-flops has a complementary pair of output terminals; and
inputs to the D terminals are derived from complementary output terminals of opposite flip-flops.

12. A digital phase-frequency detector circuit as set forth in claim 10, wherein:
said flip-flops are of the J-K type and said input terminals are the J and K terminals;
each of said flip-flops has complementary Q and Q outputs;
the Q and Q outputs of each of said flip-flops are connected to the K and J terminals, respectively, of the other of said flip-flops.

13. A digital phase-frequency detector circuit as set forth in claim 12, wherein:
said differentiating means comprise a plurality of NAND gates connected to provide a pulse of relatively short duration at the time of occurrence of a selected edge of each pulse in the input signals.

14. A digital phase-frequency detector circuit, for detecting differences in phase and frequency of two input signals, said circuit comprising:
two digital memory means, each of said memory means including
an input circuit to which a corresponding one of the input signals is coupled,
an output circuit to provide an indication of the state of said memory means,
an enabling circuit, which, when activated, renders said memory means responsive to a selected feature in the signal applied to said input circuit, said memory means being set to a first memory state upon the occurrence of the selected signal feature, and
a memory resetting circuit for resetting said memory means to a second memory state,
means for cross-coupling said output circuits to said enabling circuits, wherein each of said memory means is enabled only when the other of said memory means is in the second memory state; and
means for cross-coupling said input circuits to said memory resetting circuits, wherein each of said memory means is reset to the second memory state simultaneously with the occurrence of the selected signal feature in the input signal to the other of said memory means;
whereby said memory means are never both in the first memory state at the same time, and said output circuits provide signals indicative of the frequency and phase difference between the two input signals.

15. A digital phase-frequency detector circuit, for detecting differences in phase and frequency of two input signals, said circuit comprising:
signal processing means for obtaining processed input signals indicative of the times of occurrence of selected features of the input signals;
first and second digital memory means for receiving the respective processed input signals and providing two corresponding output signals;
means for cross-coupling the output signals from said memory means to enable inputs to opposite ones of said memory means, wherein a processed input signal applied to one of said memory means will be effective to set said memory means to a first memory state only if the other of said memory means is in a second memory state; and
means for cross-coupling processed input signals to opposite ones of said memory means, wherein a processed input signal applied to one of said memory means to set it to the first memory state will be simultaneously effective to reset the other of said memory means to the second memory state, and said first and second memory means are never both in the first memory state at the same time.

16. A method of detecting phase and frequency differences between two input signals, said method comprising the steps of:
processing each of the input signals to obtain input trigger signals at detected times of occurrence of selected input signal features;
applying the input trigger signals to two corresponding memory means;
deriving a memory means enabling signal for each memory means from the memory state of the other memory means;
setting each memory means in response to an input trigger applied thereto in the presence of an enabling signal indicating that the other memory means is reset;
resetting each memory means in response to and simultaneously with the application of an input trigger signal to the other memory means, so that said memory means are never both in a set state at the same time;
and, as a consequence of said foregoing steps, generating two output signals from the memory means, to provide an indication of the frequency and phase difference between the input signals.

17. A method of detecting phase and frequency differences as set forth in claim 16, and further including:
filtering the two output signals; and
combining the filtered output signals to obtain a signal indicative of the phase and frequency difference between the two input signals.

18. A method of detecting phase and frequency differences as set forth in claim 16, wherein:
said processing step includes differentiating the input signals to detect pulse edges of the input signals.

* * * * *